United States Patent
Eun

(10) Patent No.: US 7,968,948 B2
(45) Date of Patent: Jun. 28, 2011

(54) TRENCH ISOLATION STRUCTURE IN A SEMICONDUCTOR DEVICE AND METHOD FOR FABRICATING THE SAME

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 193 days.

(21) Appl. No.: 12/339,589

(22) Filed: Dec. 19, 2008

(65) Prior Publication Data

US 2009/0127650 A1    May 21, 2009

Related U.S. Application Data

(62) Division of application No. 11/292,603, filed on Dec. 1, 2005, now Pat. No. 7,482,246.

(30) Foreign Application Priority Data

May 18, 2005  (KR) .................. 2005-41824

(51) Int. Cl.
*H01L 29/76* (2006.01)
*H01L 31/062* (2006.01)
(52) U.S. Cl. ......... 257/374; 257/506; 257/510; 438/207
(58) Field of Classification Search .................. 257/374, 257/506, 510, E29.02; 438/207, 218–219
See application file for complete search history.

(56) References Cited

U.S. PATENT DOCUMENTS

| 7,160,787 B2 | 1/2007 | Heo et al. | |
| 7,163,869 B2 | 1/2007 | Kim et al. | |
| 2002/0076879 A1* | 6/2002 | Lee et al. | 438/241 |
| 2003/0013272 A1* | 1/2003 | Hong et al. | 438/437 |
| 2003/0199136 A1 | 10/2003 | Kim et al. | |

FOREIGN PATENT DOCUMENTS

| KR | 10-2004-0060219 A | 7/2004 |
| KR | 10-2004-0103718 A | 12/2004 |
| KR | 10-2005-0002037 A | 1/2005 |
| KR | 10-2005-0003172 A | 1/2005 |

* cited by examiner

*Primary Examiner* — Theresa T Doan
(74) *Attorney, Agent, or Firm* — Kilpatrick Townsend & Stockton LLP

(57) ABSTRACT

A trench isolation structure in a semiconductor device is provided. A semiconductor substrate has cell regions and peripheral circuit regions. First trenches have a predetermined depth and are formed in the semiconductor substrate at the cell regions. A first sidewall oxide film is formed overlying the first trenches. A first liner nitride film is formed overlying the first sidewall oxide film. Second trenches have a predetermined depth and are formed in the semiconductor substrate at the peripheral circuit regions. A second sidewall oxide film is formed overlying the second trenches. An oxide film fills the first overlying second trenches. A second liner nitride film formed on the filling oxide film. The second liner nitride film is separated from the sidewalls of the first and second trenches.

6 Claims, 5 Drawing Sheets

TRENCH ISOLATION STRUCTURE IN A SEMICONDUCTOR DEVICE AND METHOD FOR FABRICATING THE SAME

The present application is a division of U.S. patent application Ser. No. 11/292,603, filed on Dec. 1, 2005, which claims priority to Korean patent application number 2005-41824, filed on May 18, 2005, which is incorporated by reference in its entirety.

BACKGROUND OF THE INVENTION

The present invention is directed to integrated circuits and their processing for the manufacture of semiconductor devices. More particularly, the invention provides a novel trench isolation structure and method used for electrical isolation in semiconductor devices. Merely by way of example, the invention has been applied to the manufacture of dynamic random access memory (DRAM). But it would be recognized that the invention has a much broader range of applicability. For example, the invention can be applied to microprocessor devices, logic circuits, application specific integrated circuit devices, as well as various other structures.

As semiconductor devices have become highly integrated, patterns have become finer and a process for fabricating a shallow trench isolation (hereinafter, referred to as "STI") structure having small width and excellent isolation characteristics has become increasingly important. The trench isolation structure affects the characteristics of a semiconductor memory device, such as a dynamic random access memory (DRAM). For example, a liner nitride film applied to the trench isolation structure improves the refresh characteristics of the DRAM. However, the liner nitride film can also exert a negative influence on peripheral circuit regions.

FIG. 1 is a sectional view illustrating a conventional method for fabricating a trench isolation structure in a semiconductor device.

With reference to FIG. 1, a pad oxide film pattern 110 and a pad nitride film pattern 120 are formed on a semiconductor substrate 100 having active regions and isolation regions. Then, trenches 125 and 130 having a predetermined depth are formed in the semiconductor substrate 100 by an etching process. A sidewall oxide film 140 is formed overlying the sidewalls of the trenches 125 and 130 by an oxidation process, and a liner nitride film 150 and a liner oxide film 160 are formed overlying the exposed surface of semiconductor substrate 100. Thereafter, an insulation film 170, for example, a high density plasma (HDP) oxide film, is formed overlying the mesa and trench regions so that trenches 125 and 130 are filled with insulation film 170. After a planarization process is performed to expose a pad nitride film 120 to the outside, the pad nitride film 120 and a pad oxide film 110 are sequentially eliminated, thereby completing the trench isolation structure. However, liner nitride film 150 traps hot electrons at peripheral circuit regions having p-type MOS transistors, and generates attractive force to holes on the surface of the active regions, thereby causing a hot electron induced punch-through (hereinafter, referred to as "HEIP") reducing the channel width.

In the trench isolation structure shown in FIG. 1, liner nitride film 150 prevents an oxygen source from passing through the trench isolation structure in a subsequent oxidation process for forming a gate insulation film. It is well known to those skilled in the art that liner nitride film 150 causes reduction in the amount of leakage current and improves the refresh characteristics of a DRAM. However, liner nitride film 150 causes a reduction in a gapfill margin. In order to increase the gapfill margin, there is proposed a method, in which the deposition of the liner oxide film 160 is omitted and a preheating process is performed under an oxygen ($O_2$) atmosphere.

In the case that the HDP oxide film is deposited on liner nitride film 150, the $O_2$ flux is highest at bending portions (A) of the upper portion of the trench isolation structure during the preheating process and liner nitride film 150 at these portions is locally oxidized. When liner nitride film 150 at the bending portions (A) of the trench isolation structure is locally oxidized, the thickness of liner nitride film 150 at the bending portions (A) is thinned and boron (B) existing in the upper portion of the trench isolation structure is leaked to the outside, thereby causing a reduction in the threshold voltage. Further, as described above, liner nitride film 150 promotes the trapping of hot electrons at the peripheral circuit regions, and thus increases the occurrence of HEIP in p-type MOS transistors, thereby causing deterioration of characteristics of the semiconductor device, such as reduction in the threshold voltage and increase in leakage current in an OFF state.

BRIEF SUMMARY OF THE INVENTION

The present invention is directed to integrated circuits and their processing for the manufacture of semiconductor devices. More particularly, the invention provides a novel trench isolation structure and method used for electrical isolation in semiconductor devices. Merely by way of example, the invention has been applied to the manufacture of dynamic random access memory (DRAM). But it would be recognized that the invention has a much broader range of applicability. For example, the invention can be applied to microprocessor devices, logic circuits, application specific integrated circuit devices, as well as various other structures.

In a specific embodiment of the invention, a method for fabricating a trench isolation structure in a semiconductor device is provided. The method comprises forming a mask film pattern on a semiconductor substrate having cell regions and peripheral circuit regions, forming trenches in the semiconductor substrate via an etching process using the mask film pattern as an etching mask, the trenches further defining mesa regions adjacent to the trenches, forming a sidewall oxide film on exposed portions of the semiconductor substrate in the trenches, forming a first liner nitride film overlying the trenches and mesa regions; performing a first preheating process on the semiconductor substrate having the first liner nitride film formed thereon, forming a first oxide film overlying the first liner nitride film and mesa regions, forming a second liner nitride film overlying the first high density plasma oxide film, performing a second preheating process on the semiconductor substrate having the second liner nitride film formed thereon, forming a second oxide film to fill the trenches and cover the mesa regions, performing a planarization process on the second oxide film so that a surface of the mask film pattern is exposed; and removing the mask film pattern. In a specific embodiment of the invention, the first preheating process comprises loading the semiconductor substrate having the first liner nitride film formed thereon into a semiconductor processing environment; and supplying oxygen gas and helium gas into the semiconductor processing environment and generating a plasma and performing the first preheating process In a specific embodiment of the invention, a trench isolation structure in a semiconductor device is provided. The semiconductor device comprises a semiconductor substrate having cell regions and peripheral circuit regions, first trenches having a predetermined depth formed in the semiconductor substrate at the cell regions, a first sidewall oxide film formed overlying the first trenches, a first liner nitride film formed overlying the first sidewall oxide film, second trenches having a predetermined depth formed in the semiconductor substrate at the peripheral circuit regions, a second sidewall oxide film formed overlying the second trenches, a filling oxide film filling the first and second trenches; and a second liner nitride film formed on the filling oxide film, the second liner nitride film being separated from the sidewalls of the first and second trenches.

The embodiments of the present invention to provide a trench isolation structure in a semiconductor device, in which the deposition of a liner oxide film is omitted and refresh characteristics are improved without deteriorating device characteristics at peripheral circuit regions.

Many benefits are achieved by way of the present invention over conventional techniques. For example, the present technique provides an easy to use process that relies upon conventional technology. In some embodiments, a trench isolation structure in a semiconductor device and a method for fabricating the same are provided in which the deposition of a liner oxide film is omitted and refresh characteristics are improved without deteriorating device characteristics at peripheral circuit regions. In some embodiments, the occurrence of hot electron induced punchthrough is reduced and a gapfill margin for the standard trench isolation region is increased. Additionally, the method provides a process that is compatible with conventional process technology without substantial modifications to conventional equipment and processes. Depending upon the specific embodiment, one or more of these benefits may be achieved. These and other benefits will be described in more throughout the present specification and more particularly below.

Various additional features and advantages of the present invention can be more fully appreciated with reference to the detailed description and accompanying drawings that follow.

DETAILED DESCRIPTION OF THE INVENTION

Figure 1:
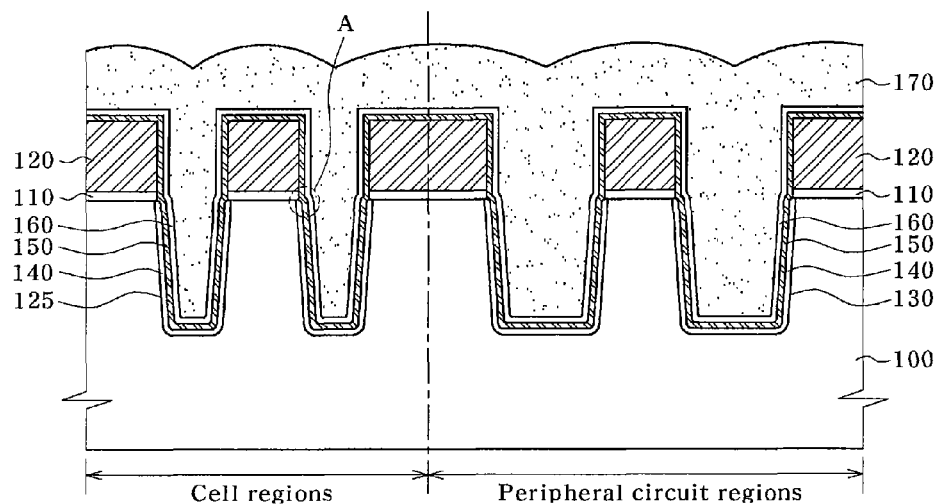
FIG. 1 is an exemplary simplified sectional view illustrating a conventional method for fabricating a trench isolation structure in a semiconductor device.

The present invention is directed to integrated circuits and their processing for the manufacture of semiconductor devices. More particularly, the invention provides a novel trench isolation structure and method used for electrical isolation in semiconductor devices. Merely by way of example, the invention has been applied to the manufacture of dynamic random access memory (DRAM). But it would be recognized that the invention has a much broader range of applicability. For example, the invention can be applied to microprocessor devices, logic circuits, application specific integrated circuit devices, as well as various other structures.

Now, a specific embodiment of the present invention will be described in detail with reference to the drawings. However, the present invention is not limited to this specific embodiment, and may have various other embodiments. In the drawings, certain elements are enlarged to clearly illustrate various layers and regions.

FIGS. 2A to 2I are sectional views illustrating a method for fabricating a trench isolation structure in a semiconductor device.

Figure 2A:
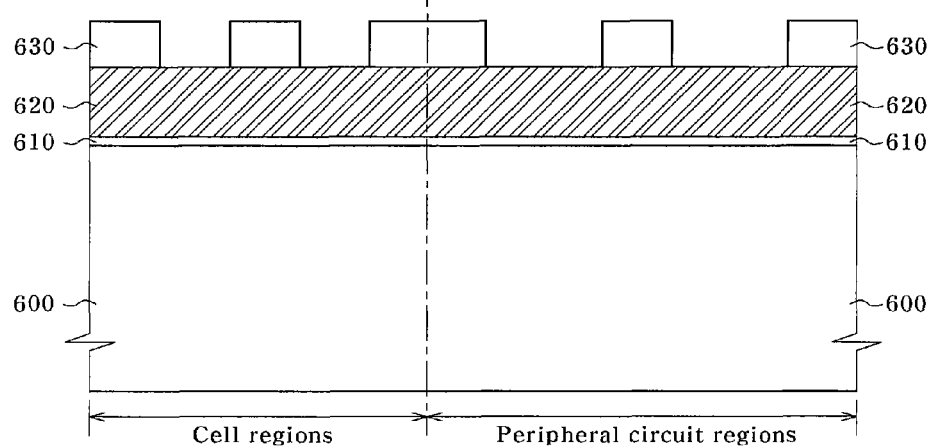
FIGS. 2A to 2I are exemplary simplified sectional views illustrating a method for fabricating a trench isolation structure in a semiconductor device

First, with reference to FIG. 2A, a pad oxide film 610 and a pad nitride film 620 are formed overlying a semiconductor substrate 600 having cell regions and peripheral circuit regions. Then, a photosensitive film pattern 630 is formed on pad nitride film 620, thereby selectively exposing pad nitride film 620. Photosensitive film pattern 630 is made of a photoresist film.

Figure 2B:
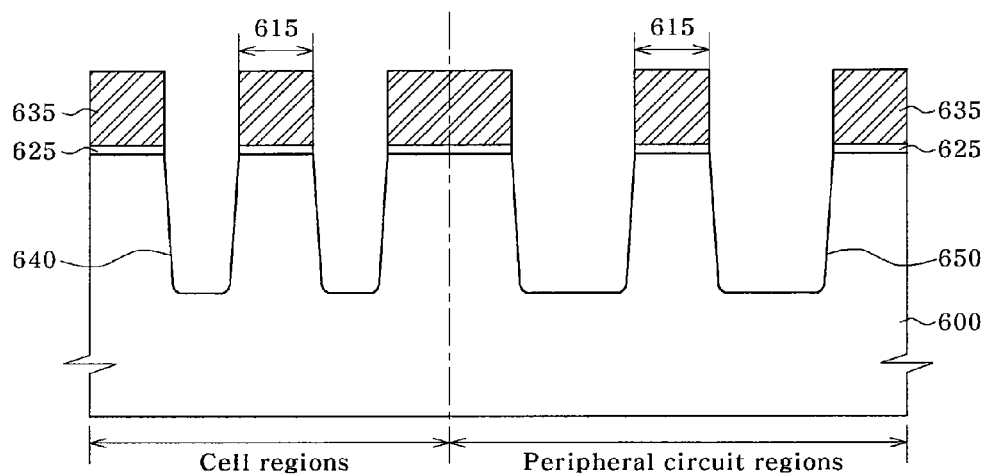

With reference to FIG. 2B an etching process is performed using photosensitive film pattern 630 as an etching mask. As a result, the exposed portions of pad nitride film 620 and pad oxide film 610 are sequentially eliminated, thereby forming a pad oxide film pattern 625 and a pad nitride film pattern 635 which exposes isolation regions of semiconductor substrate 600. Subsequently, an etching process of the exposed portions of semiconductor substrate 600 is performed, thereby forming trenches having a predetermined depth. Here, first trenches 640 having a relatively small width are formed at the cell portions, and second trenches 650 having a relatively large width are formed at the peripheral circuit regions.

Figure 2C:
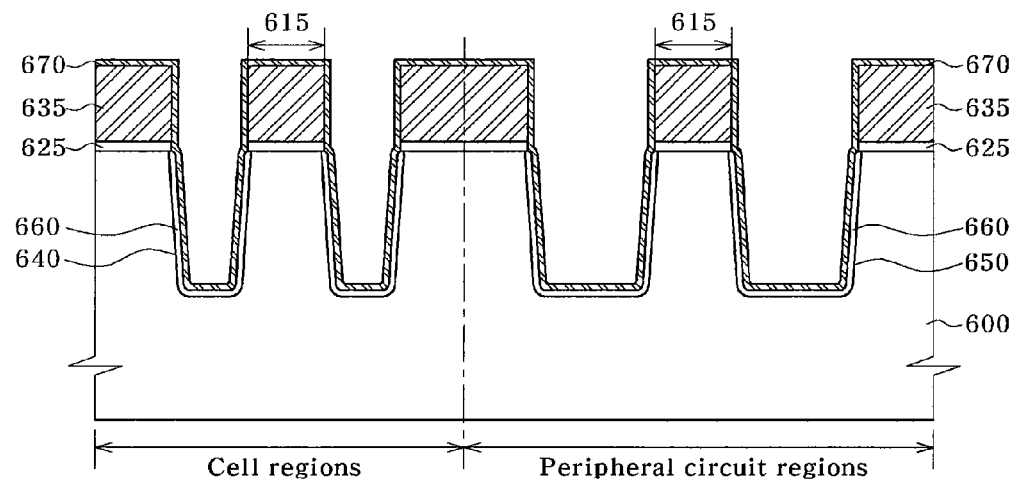

With reference to FIG. 2C, first sidewall oxide film 660 and second sidewall oxide film 665 are formed on the inner walls of the first and second trenches 640 and 650. In a specific embodiment, first and second sidewall oxide films 660 and 665 having a thickness of approximately 30-50 Å are obtained by a dry etch method. Compared to conventional sidewall oxide films having a thickness of approximately 80 Å, first and second sidewall oxide film 660 and 665 have a relatively small thickness. Thereby, stress applied to semiconductor substrate 600 is reduced, and the resulting semiconductor device has improved refresh characteristics. Thereafter, a first liner nitride film 670 is formed on the overall surface of semiconductor substrate 600. In a specific embodiment, the formation of first liner nitride film 670 is carried out in a furnace using low pressure chemical vapor deposition (LPCVD). In a specific embodiment, first liner nitride film 670 has a thickness of approximately 40-60 Å.

Figure 2D:
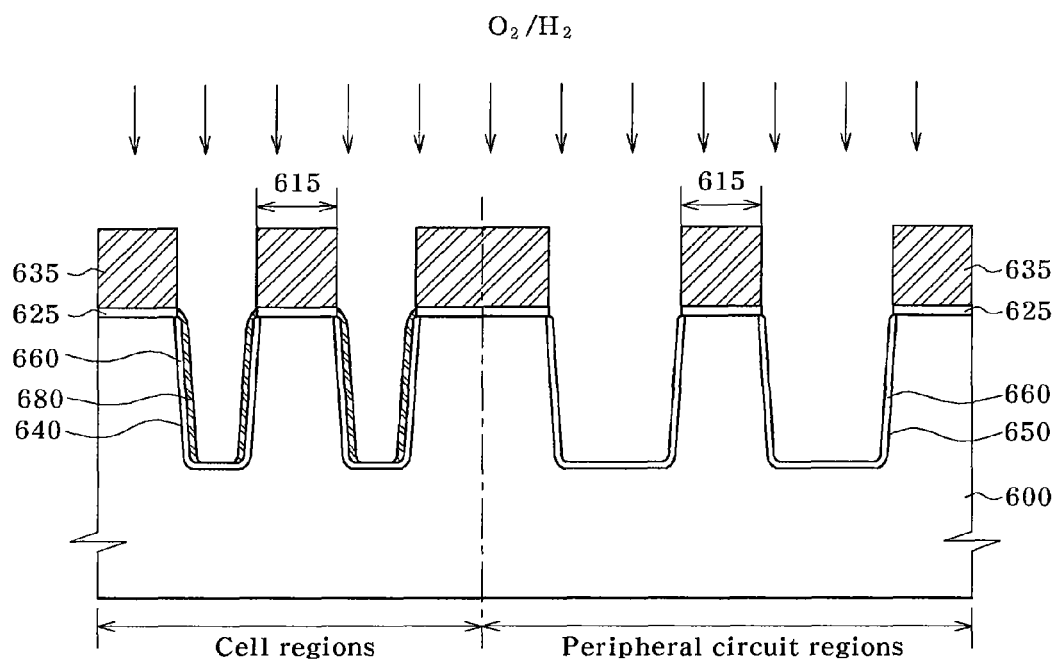

With reference to FIG. 2D, semiconductor substrate 600 having first liner nitride film 670 formed thereon is loaded into a high density plasma (HDP) chamber, and then a first preheating process is performed. In a specific embodiment, the first preheating process is performed such that oxygen ($O_2$) gas as a source gas and helium (He) gas as an additional gas are supplied to the HDP chamber and a voltage is applied to the HDP chamber for 40 seconds. In a specific embodiment, the oxygen ($O_2$) gas at a flow rate of 250-350 sccm and the helium (He) gas at a flow rate of 450-550 sccm are supplied to the HDP chamber. In order to generate plasma, a source power of 4,000-5,000 W at a low frequency is applied to the HDP chamber. After the first preheating process is performed, first liner nitride film 670 on mesa regions 615 and on the bottom of first trenches 640 in the cell regions is eliminated, while first liner nitride film 670 on the sidewalls of first trenches 640 remains. On the other hand, first liner nitride film 670 overlying mesa regions 615 and second trenches 650 in the peripheral circuit regions is eliminated. In this case, since first liner nitride film 670 at the peripheral circuit regions having p-type MOS transistors is eliminated. In a specific embodiment, this results in lower occurrence of HEIP in those regions where hot electrons are trapped are decreased. Further, the thickness of first and second sidewall oxide film 660 and 665 are decreased and a process for depositing a liner oxide film is omitted, thereby increasing a gapfill margin.

Figure 2E:
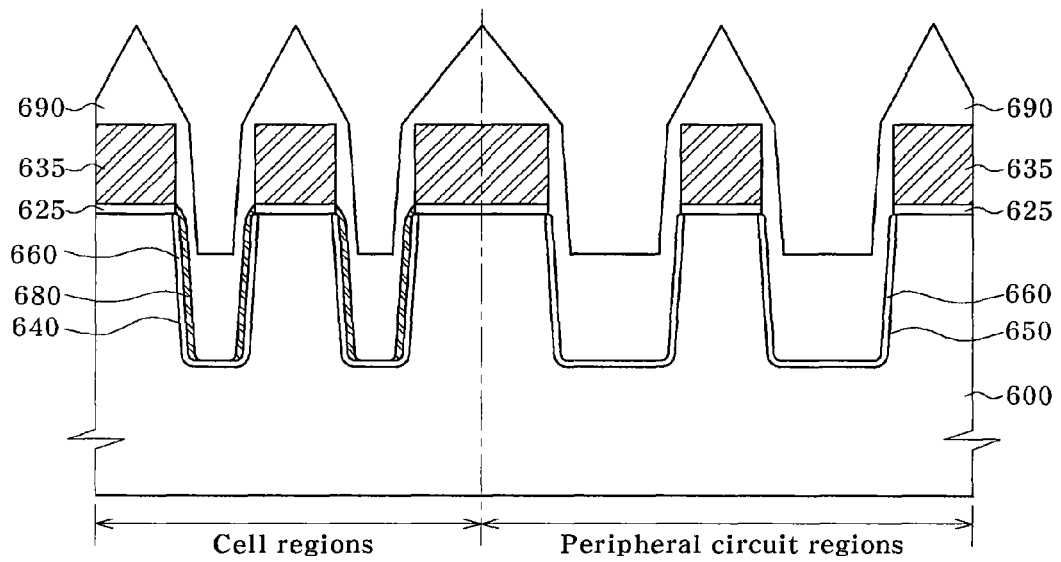

With reference to FIG. 2E, silane (SiH$_4$) gas is additionally supplied to the HDP chamber, thereby forming a first high density plasma oxide film 690 on semiconductor substrate 600. In a specific embodiment, the process conditions and gas flows may be as follows: the silane (SiH$_4$) gas at a flow rate of 30-40 sccm, the oxygen (O$_2$) gas at a flow rate of 40-50 sccm and the helium (He) gas at a flow rate of 800-1,000 sccm are supplied to the HDP chamber. Further, a voltage of 2,000-3,000 W at a low frequency and a voltage of 600-800 W at a high frequency are applied to the HDP chamber. Thereby, first high density plasma oxide film 690 having a thickness of approximately 1,400 Å is deposited. In a specific embodiment, the deposition of first high density plasma oxide film 690 is performed in-situ in the HDP chamber, where the first preheating was performed.

Figure 2F:
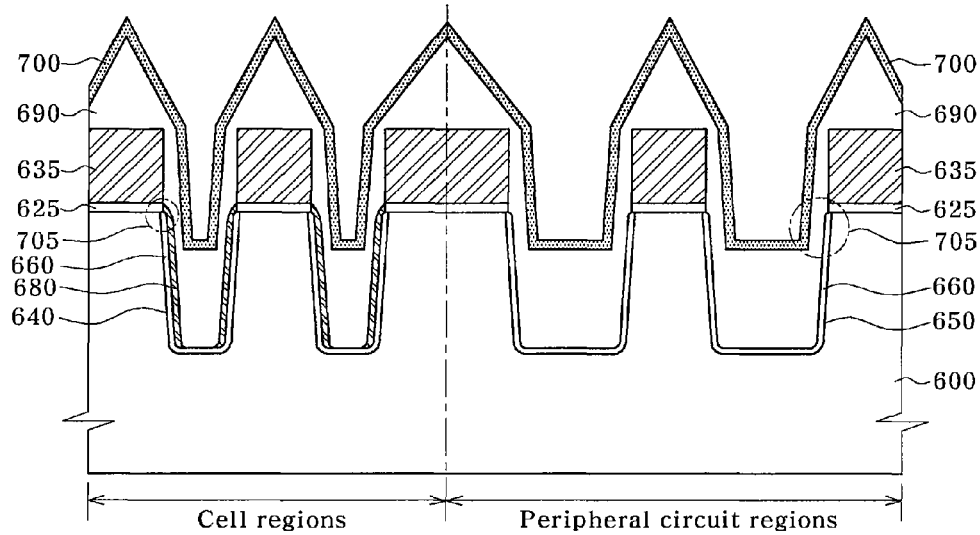

With reference to FIG. 2F, a second liner nitride film 700 is formed on first high density plasma oxide film 690. In a specific embodiment, the formation of second liner nitride film 700 is carried out in a furnace using a LPCVD process. In a specific embodiment, second liner nitride film 700 has a thickness of approximately 50-70 Å. Second liner nitride film 700 reinforces the upper portions of trenches 640 and 650, thereby preventing a decrease in the refresh time generated due to attack of an oxygen gas source in a subsequent oxidation process performed at a high temperature. Since second liner nitride film 700 having a sufficient thickness of approximately 50-70 Å is deposited on the upper portions 705 of trenches 640 and 650, it is possible to prevent decrease in threshold voltage generated due to leakage of boron (B) to the outside in a subsequent thermal process. Despite the nitride film remaining at the peripheral circuit regions having p-type MOS transistors, since second liner nitride film 700 is deposited after the deposition of first high density plasma oxide film 690, the active regions of semiconductor substrate 600 and second liner nitride film 700 are separated from each other by a considerable distance. Even though hot electrons are trapped, an electric field where positive charge is attracted to the active regions is decreased and the threshold voltage of p-type MOS transistors is not decreased, thereby reducing the occurrence of HEIP.

Figure 2G:
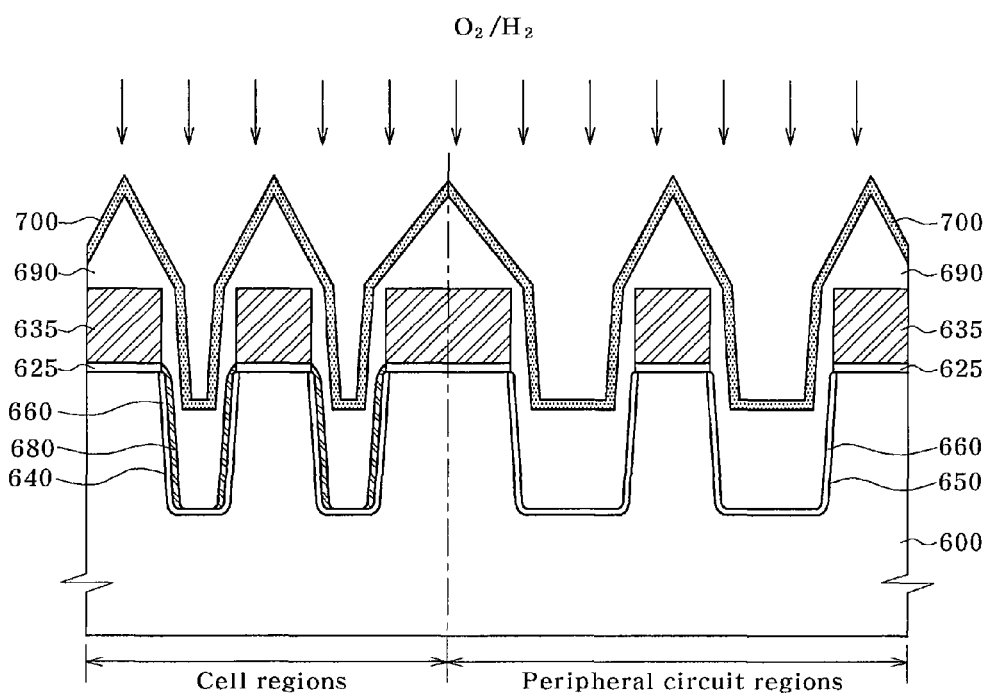

With reference to FIG. 2G, semiconductor substrate 600 having second liner nitride film 700 formed thereon is loaded into an HDP chamber, and then a second preheating process is performed. In a specific embodiment, the second preheating process is performed such that oxygen (O$_2$) gas as a source gas and helium (He) gas as an additional gas are supplied to the HDP chamber and a proper voltage is applied to the HDP chamber for 40 seconds. In a specific embodiment, the oxygen (O$_2$) gas at a flow rate of 250-350 sccm and the helium (He) gas at a flow rate of 450-550 sccm are supplied to the HDP chamber. In order to generate plasma, a source power of 4,000-5,000 W at a low frequency is applied to the HDP chamber.

Figure 2H:
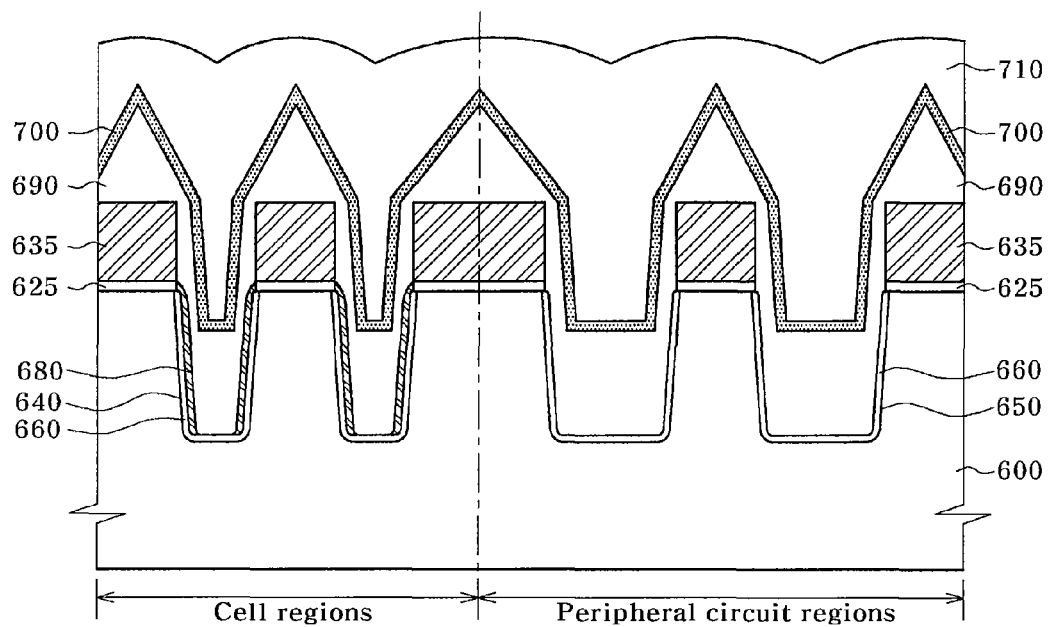

With reference to FIG. 2H, silane (SiH$_4$) gas is additionally supplied to the HDP chamber, thereby forming a second high-density plasma oxide film 710 so that second high density plasma oxide film 710 covers first trenches 640, second trenches 650, and the exposed surfaces overlying semiconductor substrate 600. In a specific embodiment, the silane (SiH$_4$) gas at a flow rate of 30-40 sccm, the oxygen (O$_2$) gas at a flow rate of 40-50 sccm and the helium (He) gas at a flow rate of 800-1,000 sccm are supplied to the HDP chamber. In a specific embodiment, a voltage of 2,500-3,500 W at a low frequency and a voltage of 1,000-2,000 W at a high frequency are applied to the HDP chamber. Thereby, second high density plasma oxide film 710 having a thickness of approximately 3,100 Å is deposited. In a specific embodiment, deposition of second high density plasma oxide film 710 is performed in-situ in the HDP chamber, where the second preheating was performed.

Figure 2I:
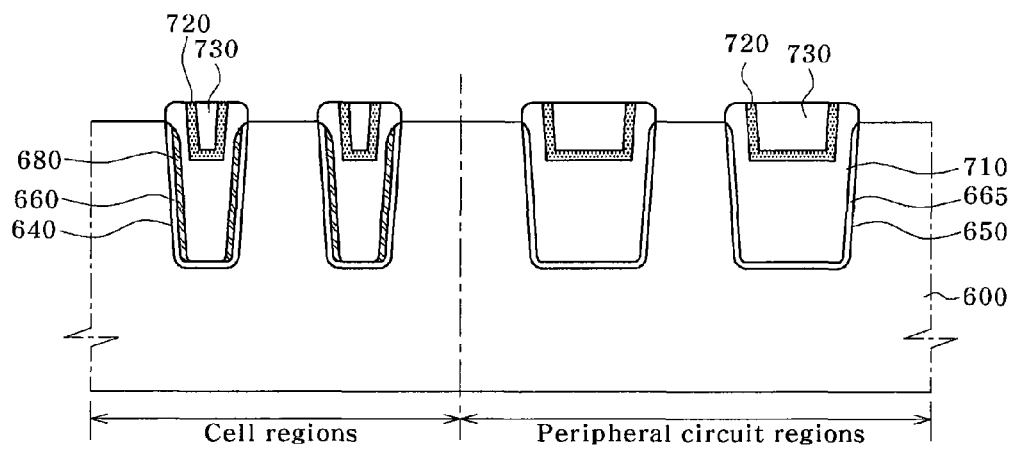

With reference to FIG. 2I, a planarization process of second high density plasma oxide film 710 is performed, thereby exposing the surface of pad nitride film pattern 635. The planarization process is carried out by a chemical mechanical polishing (CMP) process. Thereafter, the exposed portions of pad nitride film patterns 635 and pad oxide film pattern 625 are eliminated, thereby exposing a filling oxide film 730, filling first and second trenches 640 and 650. Here, filling oxide film 730 is adjacent to a second liner nitride film 720 therein, which has a predetermined distance from the wall of first and second trenches 660 and 665.

The trench isolation structure in the semiconductor device fabricated by the above-described method comprises semiconductor substrate 600 having cell regions and peripheral circuit regions, first trenches 640 having a predetermined depth formed in semiconductor substrate 600 at the cell regions, first sidewall oxide film 660 formed overlying first trenches 640, the first liner nitride film 680 formed overlying first sidewall oxide film 660, second trenches 650 having a predetermined depth formed in semiconductor substrate 600 at the peripheral circuit regions, second sidewall oxide film 665 formed on second trenches 650, and the filling oxide film 730 filling first and second trenches 640 and 650, a second liner nitride film 720 formed in filling oxide film 730, second liner nitride film 720 being separated from the sidewalls of the first and second trenches 640 and 650.

Preferably, first liner nitride film 680 is formed only at the two side portions of first trenches 640.

The method for fabricating a trench isolation structure in the semiconductor device in accordance with embodiments of the present invention reduces the thickness of the sidewall oxide film and does not require the process of depositing a liner oxide film, thus increasing the gap-fill margin. Since the second liner nitride film serving as a protective film is additionally formed, the method of the present invention prevents the decrease in refresh time generated due to attack of an oxygen gas source in an oxidation process at a high temperature. Since the second liner nitride film has a sufficient thickness, the method of the present invention does not require a liner oxide film, and minimizes the decrease in threshold voltage generated by the leakage of boron (B) occurring due to the oxidation of the liner nitride film in the preheating process. Since areas of the peripheral regions having p-type MOS transistors, in which hot electrons are trapped, are decreased, the method of the present invention reduces the occurrence of HEIP.

Embodiments of the present invention provide a trench isolation structure in a semiconductor device and a method for fabricating the same, in which the thickness of a sidewall oxide film is decreased and the deposition of a liner oxide film is omitted, thereby increasing a gapfill margin. Since a second liner nitride film serving as a protective film is additionally formed, it is possible to prevent a decrease in the refresh time generated due to attack of an oxygen gas source in an oxidation process at a high temperature. Since the second liner nitride film has a sufficient thickness, it is possible to prevent decrease in threshold voltage generated by leakage of boron (B) and to reduce the occurrence of HEIP.

Although specific embodiments of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device having a trench isolation structure, the device comprising:
- a semiconductor substrate cell region and a peripheral circuit region;
- a first trench formed in the cell region and a second trench formed in the peripheral circuit region;
- a sidewall oxide film formed on an entire surface of the first and second trenches;
- a first liner nitride film formed on the sidewall oxide film only in the cell region;
- a first filling oxide film formed in the first and second trenches;
- a second filling oxide film formed over the first filling oxide film; and
- a second liner nitride film intervened between the first filling oxide film and the second filling oxide film, the second liner nitride film being separated from the sidewalls of the first and second trenches.

2. The device as set forth in claim 1, wherein the sidewall oxide film has a thickness of 30-50 Å so as to reduce stress of the semiconductor substrate.

3. The device as set forth in claim 1, wherein the second liner nitride film has a thickness of 50-70 Å.

4. The device as set forth in claim 1, wherein the first filling oxide film includes a groove having a U-shape, wherein a bottom surface of the groove is lower than a top surface of the semiconductor substrate.

5. The device as set forth in claim 1, wherein the first filling oxide film covers the sidewall oxide film and the first nitride film in the cell region and the first filling oxide film covers the sidewall oxide film in the peripheral circuit region.

6. The device as set forth in claim 1, wherein the second liner nitride film is separated from the sidewall oxide film and the first liner nitride film by an intervening portion of the first filling oxide film.

* * * * *